(12) United States Patent
Beck

(10) Patent No.: US 9,583,662 B2
(45) Date of Patent: Feb. 28, 2017

(54) LIGHT WEIGHT SOLAR CONCENTRATOR

(71) Applicant: James Thomas Beck, Milden (CA)

(72) Inventor: James Thomas Beck, Milden (CA)

(73) Assignee: SHEC Energy Corporation, Milden (CA)

(*) Notice: Subject to any disclaimer, the term of this patent is extended or adjusted under 35 U.S.C. 154(b) by 7 days.

(21) Appl. No.: 14/401,110

(22) PCT Filed: May 14, 2013

(86) PCT No.: PCT/CA2013/000473
§ 371 (c)(1),
(2) Date: Nov. 13, 2014

(87) PCT Pub. No.: WO2013/170355
PCT Pub. Date: Nov. 21, 2013

(65) Prior Publication Data
US 2015/0103427 A1      Apr. 16, 2015

(30) Foreign Application Priority Data
May 14, 2012   (CA) ...................................... 2776680

(51) Int. Cl.
*H01L 31/05*      (2014.01)
*H01L 31/054*     (2014.01)
(Continued)

(52) U.S. Cl.
CPC ............. *H01L 31/0547* (2014.12); *F24J 2/08* (2013.01); *F24J 2/145* (2013.01); *F24J 2/4638* (2013.01);
(Continued)

(58) Field of Classification Search
CPC ............. G01B 11/26; F24J 2/10; F24J 2/1047; F24J 2/12; F24J 2/541; Y02E 10/47; Y02E 10/45
See application file for complete search history.

(56) References Cited

U.S. PATENT DOCUMENTS

| 8,056,555 | B2 | 11/2011 | Prueitt | |
| 2009/0195895 | A1* | 8/2009 | Steneby | ................ E04D 13/033 359/811 |
| 2010/0258186 | A1 | 10/2010 | Harrenstien et al. | |

FOREIGN PATENT DOCUMENTS

| DE | 4441201 A1 | 4/1995 |
| KR | 20120017082 A | 2/2012 |

(Continued)

OTHER PUBLICATIONS

KIPO Machine Translation of KR 2012-0017802.*

*Primary Examiner* — Jennifer L. Doak
(74) *Attorney, Agent, or Firm* — Olive Law Group, PLLC

(57) ABSTRACT

A solar concentrator has frame members connected together to form a framework, and a flexible sheet attached to the framework such that the flexible sheet takes a loose shape and can flex in response to shaping forces exerted thereon. The sheet has a reflective surface located between the frame members. A shaping force system is operative, when activated, to exert the shaping forces on the sheet, the shaping forces configured to draw the sheet from the loose shape into a desired shape such that solar rays striking the reflective surface are focused on a target, and a solar energy receiver is attached to the framework at a location corresponding to the target. Thin wall tubing filled with pressurized air can provide strong light frame members. When the shaping force system is deactivated, the flexible sheet reverts substantially to the loose shape.

14 Claims, 6 Drawing Sheets

(51) Int. Cl.
  *F24J 2/08*    (2006.01)
  *F24J 2/14*    (2006.01)
  *F24J 2/46*    (2006.01)
  *G02B 7/183*   (2006.01)
  *H01L 31/052*  (2014.01)
  *H01L 31/18*   (2006.01)

(52) U.S. Cl.
  CPC ............ *G02B 7/183* (2013.01); *H01L 31/0521* (2013.01); *H01L 31/18* (2013.01); *H02S 20/32* (2014.12); *Y02E 10/45* (2013.01); *Y02E 10/52* (2013.01); *Y10T 29/49355* (2015.01)

(56) References Cited

FOREIGN PATENT DOCUMENTS

KR    20120017802 A  *  2/2012
WO        9100482 A1    1/1991

* cited by examiner

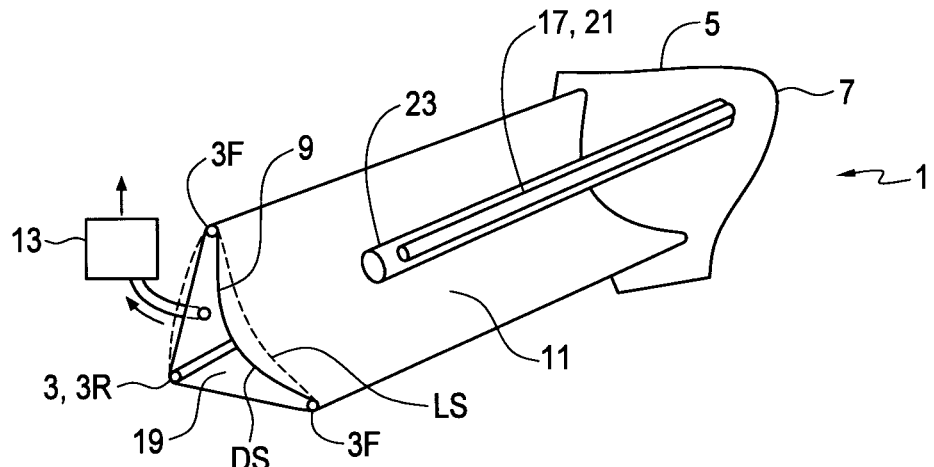
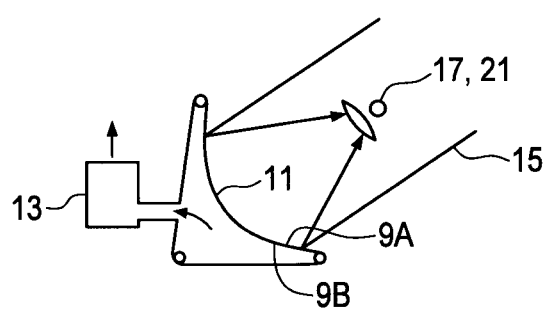
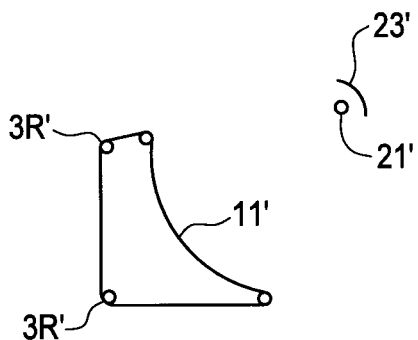
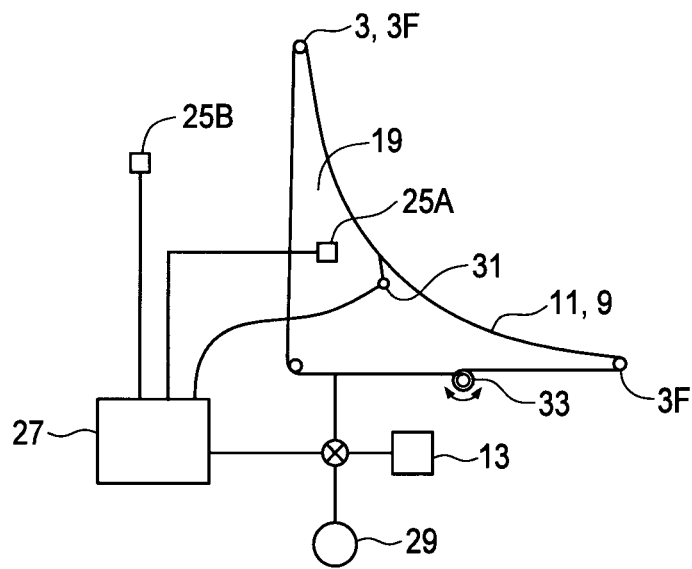
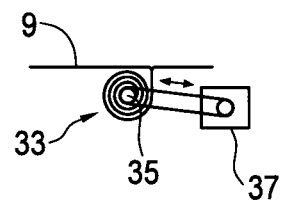

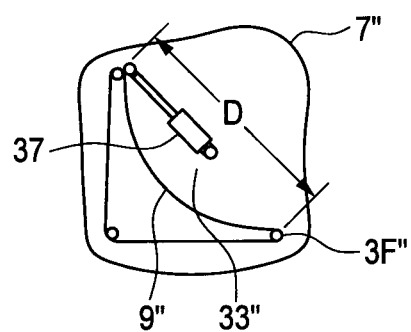
FIG. 6
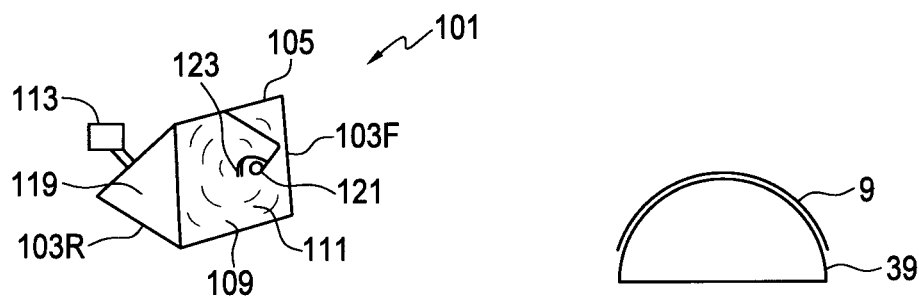
FIG. 7
FIG. 8
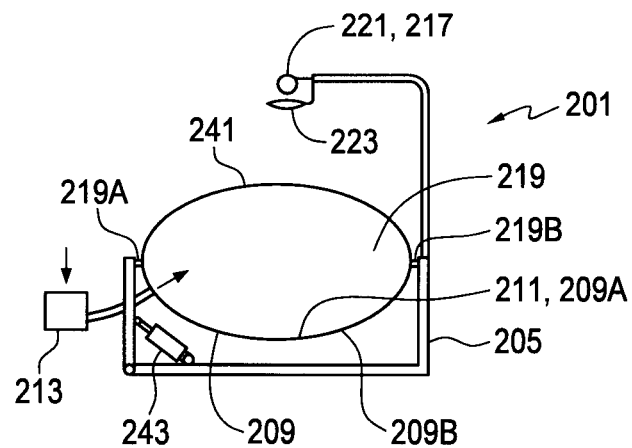
FIG. 9

LIGHT WEIGHT SOLAR CONCENTRATOR

CROSS REFERENCE TO RELATED APPLICATIONS

This application is a 35 USC 371 application of International PCT Patent Application No. PCT/CA2013/000473, filed on May 14, 2013, which claims priority to Canadian Patent Application No. 2776680, filed May 14, 2012; all of the contents of which are hereby incorporated by reference herein in their entireties.

This invention is in the field of equipment for collecting and concentrating solar energy and in particular an economical light weight apparatus for collecting and concentrating solar rays.

BACKGROUND

Considerable effort is directed to efficiently and effectively harnessing solar energy. Photo voltaic (PV) panels convert received solar rays directly into electrical energy, while thermal systems concentrate solar rays to produce heat, which can be used directly for heating purposes, or is used to produce rotating mechanical power by operating a Stirling engine for example, or more commonly by creating steam to operate a steam turbine, which can then be used to produce electrical power. Solar power may also be concentrated on a PV panel to increase the amount of solar energy received on a given area of panel, and thus increase the power generated from the panel.

A typical solar collection and concentration system uses mirrors to reflect solar rays from a wide area onto a much smaller target such that the solar energy from the wide area is concentrated at the target. In concentrating point focus systems a parabolic dish focuses sunlight onto a solar receiver. The parabolic shape is preferred as it focuses the solar rays on a small target, thereby increasing the temperature at the target. Dishes can typically vary in size and configuration from a small diameter of perhaps 1 meter to much larger structures of a dozen or more meters in diameter. Point focus dish concentrators are mounted on tracking systems that track the sun in two axes, directly pointing at the sun, and the receiver is attached to the dish at the focal point so that as the dish moves, the receiver moves with it. These point focus systems can generate high temperatures exceeding 800° C. and even 1,800° C.

In central tower systems a solar receiver is mounted at the top of a tower. The tower is surround by heliostats, which are flat mirrors that redirect sunlight to the top of the tower and are controlled to track the sun and move so that sunlight is reflected in a constant direction at the receiver. Hundreds or thousands of heliostats may work in unison to direct sunlight to the top of the tower to generate high temperatures from 500° C. to 1,100° C. or more, typically used to operate a steam turbine.

A trough concentrator is a long concave trough shaped concentrator that forms a line focus instead of a point focus as is achieved in both the Point Focus Dish and Central tower designs. Again a parabolic shape is preferred for the cross section of the trough to concentrate the rays on a narrow line. This has typically been the lowest cost solar collection technology due to its simplicity. The long trough concentrator focuses its light onto a solar receiver tube that runs the length of the solar trough concentrator. Depending on the latitude of the location, the troughs are oriented length wise in a North-South or East-West direction, and then pivot on their longitudinal axes such that the concave faces of the troughs follow the sun. These trough concentrators thus are only required to pivot on one axis, rather than on two axes as is required with point focus concentrators. Trough concentrators cannot produce as high a temperature as either the point focus dish or central tower designs since it cannot focus to a point and can only focus to a line. Temperatures of typically less than 600 C can be achieved.

A major cost of any operation using solar energy is in the solar collection field, which can be made up of hundreds or thousands of concentrators. The reflective surface is typically provided by polished aluminum or glass mirrors. The glass or metal sheets of the mirror can be curved to form the required focusing shape or are often made up of an array of smaller flat mirror segments arranged on a frame to achieve the focusing effect. The mirrors are heavy, requiring significant structural support to carry the load of the mirrors and provide sufficient rigidity to maintain focus. These heavy structures also require heavy and expensive motors and gear boxes to steer the solar array to appropriately focus the sunlight.

To reduce the demands on the frame and tracking system light weight linear tensioned thin-film trough concentrators have been developed where a thin film of reflective sheet material is stretched over a framework. The framework comprises parabolic shaped ribs mounted side by side along the length of the trough, and then the film is attached to one end of the trough and stretched along the outside convex faces of the ribs and attached under tension at the opposite end. Such thin film trough concentrators are disclosed for example in United States Patent Application Number 2010/0258186 of Harrienstien et al. and U.S. Pat. No. 8,056,555 to Prueitt.

These thin film trough concentrators significantly reduce the weight of the mirror apparatus compared to more traditional designs utilizing rigid backed reflective material, with a corresponding reduction in the strength requirements of the frame and tracking system. The framework must however be sufficiently strong to resist deformation due to the considerable tension on the film stretched from end to end of the trough.

SUMMARY OF THE INVENTION

It is an object of the present invention to provide a system for collecting and concentrating solar rays that overcomes problems in the prior art.

In a first embodiment the present invention provides a solar concentrator apparatus comprising a plurality of frame members connected together to form a framework, and a flexible sheet attached to the framework such that the flexible sheet takes a loose shape and can flex in response to shaping forces exerted thereon, the flexible sheet having a reflective surface located between the frame members. A shaping force system is operative, when activated, to exert the shaping forces on the flexible sheet, the shaping forces configured to draw the flexible sheet from the loose shape into a desired shape such that solar rays striking the reflective surface are substantially focused on a target, and a solar energy receiver is attached to the framework at a location substantially corresponding to the target. When the shaping force system is deactivated, the flexible sheet reverts substantially to the loose shape.

In a second embodiment the present invention provides a method of making a solar concentrator. The method comprises connecting frame members to form a framework and loosely attaching a flexible sheet to the framework such that the flexible sheet takes a loose shape and can flex in response to shaping forces exerted thereon, the flexible sheet having a reflective surface located between the frame members; exerting the shaping forces on the flexible sheet, the shaping forces configured to draw the flexible sheet into a desired shape such that solar rays striking the reflective surface portion are substantially focused on a target; attaching a solar energy receiver to the framework at a location substantially corresponding to the target. Removing the shaping forces causes the flexible sheet to revert substantially to the loose shape.

The concentrators of the present invention significantly lower the cost of solar collection. In embodiments where the apparatus moves to track the sun, the invention uses very light weight film material such as polyvinyl chloride (PVC), Mylar™, polymers or any like material that can form a thin plastic like film. Using this material reduces the weight of a solar array very significantly compared to the glass and metal of the prior art. This weight reduction dramatically reduces the structural strength requirement of the framework used to hold the reflective film. The film is not tightly stretched and so the framework does not need to be built to resist the stress of such stretching and can be much lighter.

DESCRIPTION OF THE DRAWINGS

While the invention is claimed in the concluding portions hereof, preferred embodiments are provided in the accompanying detailed description which may be best understood in conjunction with the accompanying diagrams where like parts in each of the several diagrams are labeled with like numbers, and where:

FIG. 1 is a schematic perspective view of an embodiment of a trough vacuum solar concentrator apparatus of the present invention;

FIG. 2 is a schematic end view of the embodiment of FIG. 1;

FIG. 3 is a schematic end view of a variant of the embodiment of FIG. 1 with an additional rear frame member;

FIG. 4 is a schematic end view of a vacuum solar concentrator system using the concentrator of FIG. 1;

FIG. 5 is a schematic more detailed end view of the deflection adjuster of FIG. 4;

FIG. 6 is a schematic end view of an alternate deflection adjuster for the system of FIG. 4;

FIG. 7 is a schematic perspective view of an embodiment of a point focus vacuum solar concentrator apparatus of the present invention;

FIG. 8 is a schematic side view of a mold for forming a flexible sheet of the invention into a parabolic shape;

FIG. 9 is a schematic end view of an embodiment of a point focus or trough solar concentrator apparatus of the present invention with an elongated football shaped pressurized chamber;

DETAILED DESCRIPTION OF THE ILLUSTRATED EMBODIMENTS

Figure 10:
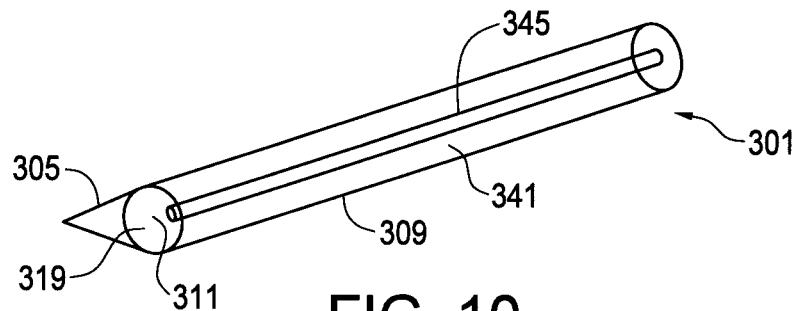
FIG. 10 is a schematic perspective view of a an embodiment of a trough pressurized solar concentrator apparatus of the present invention.

FIGS. 1 and 2 schematically illustrate sectional views of an embodiment of a solar concentrator apparatus 1 of the present invention. The apparatus 1 comprises a plurality of frame members 3 connected together to form a framework 5. In the illustrated apparatus 1 the framework comprises substantially parallel upper and lower front frame members 3F extending between right and left ends of the framework 5, and a rear frame member 3R extending between the right and left ends of the framework 5 parallel to the upper and lower front frame members 3F. The frame members 3F, 3R are attached to endplates 7 at each end of the framework 5.

A flexible sheet 9 is attached to the framework 5 such that the flexible sheet 9 takes a loose shape LS, indicated by the dotted lines in FIG. 1, and can flex in response to shaping forces exerted thereon. The flexible sheet 9 has a reflective surface 11 located between the upper and lower front frame members 3F.

A shaping force system 13 is operative, when activated, to exert the shaping forces on the sheet 9. The shaping forces are configured to draw the flexible sheet 9 from the loose shape LS into a desired shape DS such that solar rays 15 striking the reflective surface 11 are substantially focused on a target 17, as schematically illustrated in FIG. 2.

In the illustrated apparatus 1, the flexible sheet 9 is a thin film material, such as PVC, Mylar™, polymers or any like material that can form a thin plastic like film. Because they are so thin, most films are virtually transparent but can easily be mirrored with any number of mirroring processes such as is used in current glass mirroring processes or by using sputtering or vacuum deposition of thin metallic reflective layers onto the film. The film could be applied to either the external or internal portion of the film material. Internal application of the reflective coating would provide better weather protection.

In the illustrated apparatus 1 the shaping force system 13 exerts the shaping forces by creating an air pressure differential between opposite first and second sides 9A, 9B of the flexible sheet 9. When activated, the shaping force system 13 draws air away from the second side 9B of the flexible sheet 9 such that a vacuum is formed and the flexible sheet 9 flexes such that the reflective surface 11 assumes a concave curved shape.

The flexible sheet 9 is supported on the upper and lower front frame members 3F with the first side 9A thereof facing forward between the upper and lower front frame members 3F, and forms a front side of a sealed chamber 19. When activated, the shaping force system 13 draws air out of the chamber 19 and the reflective surface 11 of the flexible sheet 9 forms a concave trough concentrator. The reflective coating that makes the reflective surface 11 can be on the first side 9A of the flexible sheet 9 where it is exposed to the atmosphere, or in most cases it is beneficial to have the reflective surface on the second side 9B inside the chamber 19 protected from the elements.

In the illustrated apparatus 1, the flexible sheet 9 wraps around the outside of the front and rear frame members 3F, 3R to form the sealed chamber 19 with the reflective surface 11 of the flexible sheet 9 facing forward between the upper and lower front frame members 3F. Right and left side edges of the flexible sheet 9 can be sealed to the end plates 7 by tape or the like, or wrapped around the end plates, or secured in a similar manner to seal the chamber 19. There will thus be a deformity at the ends of the trough, however same should not be significant.

The shaping force system 13 is provided by a vacuum pump which draws air out of the chamber 19, such that atmospheric pressure is greater than the pressure inside the chamber 19 and the pressure of the atmosphere pushes the reflective surface 11 of the flexible sheet 9 into the shape of a concave trough concentrator. When the shaping force system is deactivated, atmospheric air can flow into the chamber 19, equalizing forces on each side 9A, 9B of the flexible sheet 9, which then reverts to the loose shape LS. The vacuum pressure differential required to resist fluttering and deformation in the wind is quite low, a fraction of a pound per square inch should be sufficient.

It is contemplated that instead of wrapping the flexible sheet 9 around the framework 5 to form the chamber 19, the flexible sheet could be sealed to the upper and lower frame members 3F and the end plates 7, and the rear side could be enclosed with a separate material to form the chamber.

Figure 20:
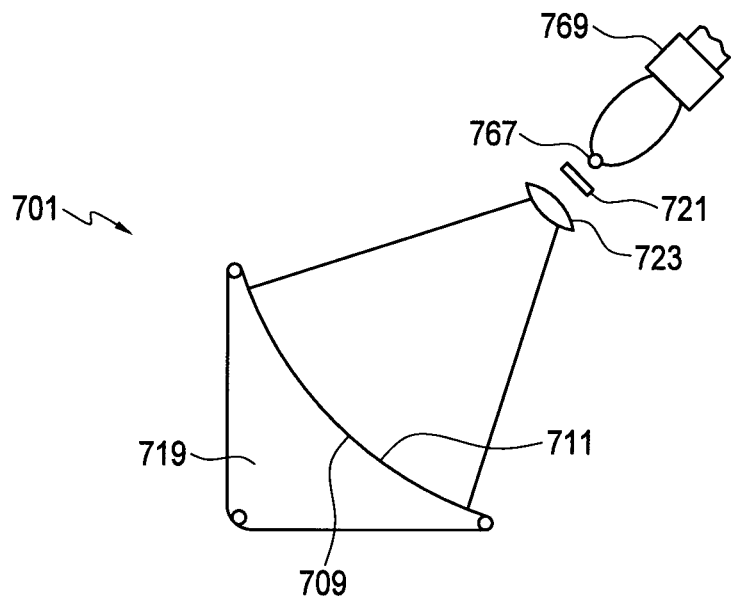
FIG. 20 is a schematic end view of a further alternate embodiment of a thin film solar concentrator apparatus of the present invention wherein the flexible sheet forms a concave trough concentrator and the receiver comprises a line of photovoltaic solar cells.

A solar energy receiver 21 is attached to the framework 5 at a location substantially corresponding to the target 17. In the illustrated apparatus 1 the receiver 21 is a pipe filled with circulating heat transfer fluid and attached at each end thereof to the end plates 7 of the framework 5. The solar energy receiver could also be a line of photovoltaic cells operative to produce electricity directly, for example as schematically illustrated in FIG. 20 described later in this specification.

The reflective surface 11 takes the shape of a segment of a circular arc, rather than the preferred parabolic arc, such that the focus is blurred. To resolve this, a focus correcting device is included in the apparatus 1 to compensate for the misalignment of the solar rays 15 and bring the solar rays 15 into sharp focus. In the apparatus 1, of FIG. 1, the focus correcting device is provided by a corrective lens 23 located between the reflective surface 11 and the receiver 21.

FIG. 3 illustrates an alternate embodiment of the apparatus 1' where the focus correcting device is provided by a curved corrective mirror 23' located such that the receiver 21' is between the reflective surface 11' and the mirror 23'. By way of demonstration that the framework of the present invention can take many shapes, in the apparatus 1' of FIG. 3 the framework comprises upper and lower rear frame members 3R', instead of the single rear frame member 3R shown in FIG. 1. Additional frame members 3' may be added as required depending on the width and length of the framework.

The corrective lens 23 or mirror 23' is relatively narrow, requiring a relatively minor amount of material and support in comparison to systems where the primary mirror is made from heavy glass or metal. It is contemplated that the addition of the focus correcting device will be warranted in most applications where higher temperatures are desired, since bringing the solar rays into tight focus with the corrective lens or mirror will increase the temperatures generated in the heat transfer fluid in the receiver 21, providing enough additional useful energy to cover the added expense.

FIG. 4 schematically illustrates a contemplated solar concentrator system with a sealed chamber. The system is shown with a vacuum chamber, however a pressurized chamber as described later in this specification could benefit from a similar system for conditioning the atmosphere inside the camber as well. The system would have sensors 25A, 25B inside and outside the chamber 19 for measuring the differential pressure between the atmosphere and the inside of the chamber 19. An internal atmosphere control 27 would control the differential pressure to maintain the desired shape. The control 27 would also purge the air in the chamber 19 with a dry gas such as dry air or dry nitrogen from a source 29. Moisture deteriorates the reflective mirror coating and removing moisture from the air inside the chamber will prolong the life of the mirror coating. To purge the chamber 19 to remove moist air initially, a valve located at the opposite end of the chamber 19 from the source 29 would be opened to allow the dry nitrogen to feed through the chamber. Having dry air in the chamber 19 prevents condensation and water which causes corrosion of mirror surfaces. Barometric pressure variations as well as air temperature variations will be compensated for. If excess pressure builds in the chamber, the vacuum pump of the shaping force system 13 will suck air from the chamber 19. If internal air pressure becomes too low, a dry air or dry nitrogen from source 29 will be fed into the chamber.

A deflection sensor 31 is operative to sense deflection of the flexible sheet 9 away from the desired shape, due to contraction or extension of the flexible sheet 9 due to temperature changes, stretching of the material, or the like and a deflection adjuster 33 is provided to correct any such deflection. In the illustrated vacuum solar concentrator system of FIG. 4 the deflection adjuster 33 comprises a rod 35 extending substantially parallel to the frame members 3 along the length of the chamber 19. The flexible sheet 9 winds around the rod 35 such that rotating the rod 35 in a first direction draws the flexible sheet 9 onto the rod 35, reducing the length of the flexible sheet 9 that is between the upper and lower front frame members 3F and thus increases the radius of the concave trough, and rotating the rod in an opposite second direction rolls the flexible sheet 9 off the rod 35, increasing the length of the flexible sheet 9 that is between the upper and lower front frame members 3F and thus decreases the radius of the concave trough. Thus the radius of the trough can be monitored and maintained at the desired radius.

It is contemplated that the deflection adjuster 33 could take other forms. For example FIG. 6 schematically illustrates and alternate deflection adjuster 33″ that comprises actuators 37 mounted to the end plates 7″ of the framework and is operative to adjust the distance D between the upper and lower front frame members 3F″ and thereby change the radius of curvature of the flexible sheet 9″.

The trough embodiment of this invention as described above is the easiest due to the one dimensional bend required for the flexible sheet. A point focus solar concentrator on the other hand has to have a two dimensional bend in the material. For example with a piece of paper, it is easy to bend in one direction or the other direction, but if it is attempted to bend all four sides up at once, the paper tends to crinkle. In the point focus embodiment of this invention, the material used will have a bearing on how the curvature is formed. If a plastic film has enough elasticity, it could stretch to form a spherical shape focus, however it could be difficult to maintain focus with an elastic material.

If the material has some rigidity, such as light weight plastic, Mylar™, or thin glass, heat can be carefully applied in a manufacturing process, typically under computer control to selectively shrink the plastic film in areas where it would want to crinkle. FIG. 8 shows a flexible sheet 9 draped over a parabolic dish shaped mold 39 with heat applied. For example very thin glass, such as gorilla glass that is over 100 times stronger than regular glass, could be drooped over the mold at the drooping temperature of the glass to form the parabolic dish shape desired. Once mounted to the framework, the partial vacuum of the system could then provide the support to maintaining the parabolic curved shape. Parabolic shaping is not possible for the trough concentrators, as the flexible sheet there bends in only one direction.

FIG. 7 schematically illustrates an alternate apparatus 101 where the framework 105 comprises perimeter front upper, lower, right, and left frame members 103F forming a rectangular opening and rear frame member 103R supporting the front frame members. The perimeter frame could also be circular. The flexible sheet 109 is a thin film material and again the shaping force system 113 exerts the shaping forces by creating an air pressure differential between sides of the flexible sheet 109. The flexible sheet 109 is supported on the perimeter front frame members 103F with the reflective surface 111 thereof facing forward between the perimeter front frame members 103F, and forms a front side of a sealed chamber 119. When activated, the shaping force system 113 draws air out of the chamber 119 and the reflective surface 111 of the flexible sheet 109 forms a point focus concentrator directing solar rays at the receiver 121.

The flexible sheet 109 can be preformed, as described above and in FIG. 8, prior to attachment to the framework 105 such that when the shaping force system 113 is activated, the reflective surface 111 of the flexible sheet 109 substantially takes the form of a parabolic dish. Where the flexible sheet 109 is not molded into a parabolic shape, a focus correcting device 123, such as a lens or mirror as described above, is mounted on the framework 105 and is operative to correct the focus of the solar rays on the receiver 121.

FIG. 9 schematically illustrates an alternate apparatus 201 wherein when activated, the shaping force system 213 pushes air against the first side 209A of the flexible sheet 209 such that the flexible sheet 209 flexes and the reflective surface 211 assumes a concave curved shape. Again, the reflective coating that makes the reflective surface 211 can beneficially be on the first side 209A of the flexible sheet 209 where it is inside the chamber 219 protected from the elements, rather than on the second side 209B exposed to the atmosphere.

In the apparatus 201, the flexible sheet 209 is formed into a hollow sealed balloon like chamber 219 mounted on the framework 205 with the reflective surface facing an opposite transparent face 241 of the flexible sheet 209, and the shaping force system 213 directs pressurized air into the chamber 219. The illustrated chamber 219 is an elongated football shape such that when the shaping force system 213 is activated, the reflective surface 211 of the flexible sheet 209 substantially takes an elongated dish shape operative as a point focus concentrator. Because the reflective surface 211 is elongated, the radius of same is such that the target 217, and thus the receiver 221, are outside the chamber 219. This is advantageous because as described below in some cylindrical or spherical embodiments where the reflective surface is circular, the target can be right at the wall opposite the reflective surface, where damage to the wall will occur because of the high temperature.

The flexible sheet 209 can be preformed prior to attachment to the framework 205 such that when the shaping force system 213 is activated, the reflective surface 211 of the flexible sheet substantially takes the form of a parabolic dish with a sharp focus. Where the flexible sheet 209 is not preformed, a focus correcting device 223, such as a lens or mirror as described above, is mounted on the framework 205 and is operative to correct the focus of the solar rays on the receiver 221. An actuator 243 can also be provided to adjust the distance between ends 219A, 219B of the chamber 219 to move the target 217. The football shaped cross section can also be used as a trough collector instead of a point focus collector.

Figure 11:
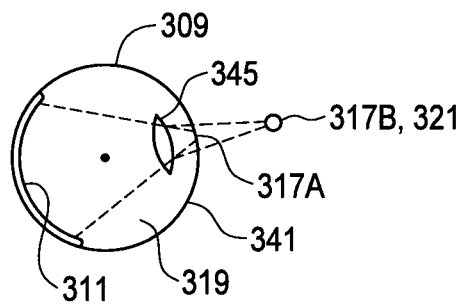
FIG. 11 is a schematic end view of the embodiment of FIG. 10.

FIGS. 10 and 11 schematically illustrate another alternate apparatus 301 where the chamber 319 is substantially cylindrical such that the reflective surface 311 forms a trough concentrator opposite a transparent face 341 of the chamber. A problem with this configuration is that, with a circular arc to the reflective surface 311, the target 317 is about twice the radius away from the reflective surface 311, which is right on the transparent wall portion 341. Thus a focus adjustment apparatus 345 is installed inside the chamber 319 that is operative to move the target. In the embodiment of FIGS. 10 and 11, the focus adjustment apparatus 345 is illustrated as a lens operative to move the target away from the natural target location 317A to a point outside the chamber 319 away from the wall of the chamber 319 at adjusted location 317B where the heat caused by the concentrated solar rays will not damage the wall. The lens is located between the reflective surface 311 and the receiver 321 located at the adjusted target location 317B outside the chamber.

Figure 12:
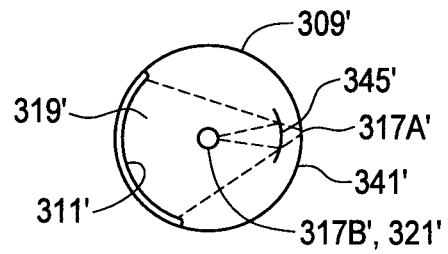
FIG. 12 is a schematic end view of a variant of the embodiment of FIG. 10 where the target and solar receiver are inside the pressurized chamber.

FIG. 12 schematically illustrates a variation of the cylindrical chamber 319′ where the focus adjustment apparatus 345′ is provided by a mirror located inside the chamber 319′ between the reflective surface 311′ and the transparent face 341′. This version moves the adjusted target location 317B′ to a point in about the middle of the chamber 319′, which is away from the walls of the chamber 319′ so same are not damaged. With the target and the receiver 321′ inside the chamber 319′, considerable heat is generated inside the chamber 319′. Such heat can be problematic as the flexible sheet 309′ material must be able to withstand high temperatures without excessive stretching or damage.

Figure 13:
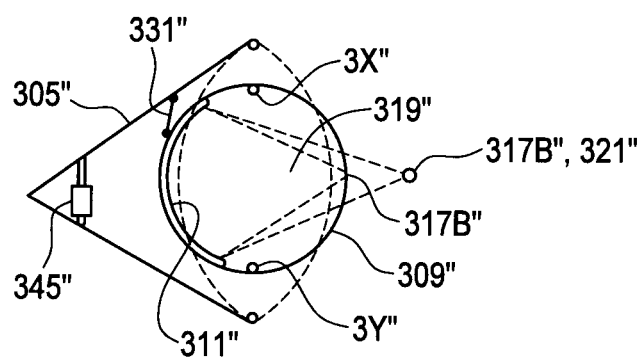
FIG. 13 is a schematic end view of a variant of the embodiment of FIG. 10 where the frame members move to move the flexible sheet into the football shape of FIG. 9 and the target moves out of the chamber.
Figure 14:
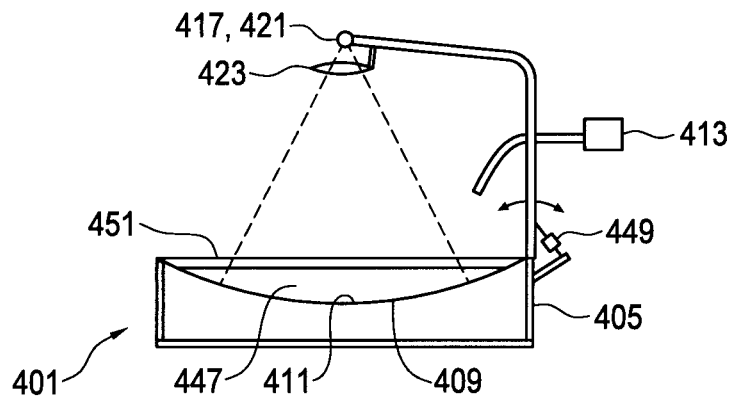
FIG. 14 is a schematic end view of an embodiment of a horizontal liquid filled solar concentrator apparatus of the present invention.
Figure 15:
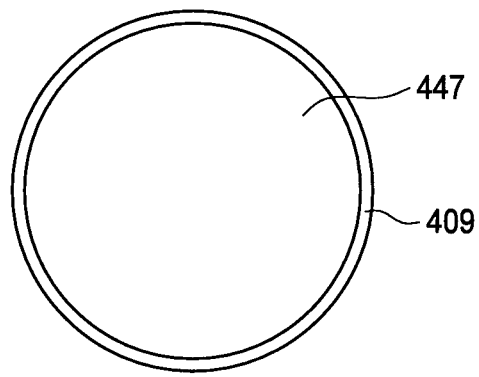
FIG. 15 is a schematic top view of the embodiment of FIG. 14.

FIG. 13 schematically illustrates another variation of the cylindrical chamber 319" where the focus adjustment apparatus 345" has an actuator operative to adjust a distance between first and second frame members 3X", 3Y" of the framework 305". Increasing the distance between the frame members 3X", 3Y" changes the cross-section of the chamber as shown, increasing the radius of the reflective surface 311" and moving the adjusted target location 317B" outside the chamber 319". The chamber 319" then assumes substantially the elongated football shape of the chamber 219 of FIG. 9. A framework with fixed frame members could also provide the football shape, with adjustments provided by a film winding mechanism such as the deflection adjuster 33 described above, or the like. A deflection sensor 331" operative to sense deflection of the flexible sheet 309 away from the desired shape can be provided, and the actuator, winding mechanism, or the like can also serve as a deflection adjuster operative to correct the deflection.

Where the focus adjustment apparatus is a lens or mirror, same may be also operative to correct the focus of the solar rays on the receiver. Where the focus adjustment apparatus moves the frame members, a further focus correcting apparatus would be needed if high temperatures at the receiver are desired, FIGS. 14 and 15 schematically illustrate a further alternate apparatus 401 of the present invention where the flexible sheet 409 is a thin film material supported in a substantially horizontal position by the framework 405 with the reflective surface 411 facing upward, and wherein the shaping force system 413 deposits a clear liquid 447, typically water, on the reflective surface 411 of the flexible sheet 409. The sectional shape of this embodiment is not a circular radius, or catenary, but the shape will concentrate solar rays on a point focus or trough target, and a focus correction apparatus 423, provided by a lens as illustrated or a mirror, corrects the focus. As the apparatus 401 must be oriented horizontally to keep the liquid on the flexible sheet 409, the target 417 will move as the sun crosses the sky, and the receiver 421 is mounted on an arm and actuator mechanism 449 of the framework 405 that is operative to move the receiver 421 to follow the target 417. Typically a transparent cover sheet 451 covering the liquid 447 is provided to prevent evaporation and contamination of the liquid 447.

Figure 16:
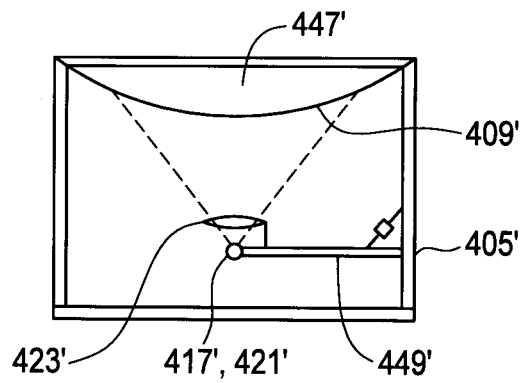
FIG. 16 is a schematic end view of the embodiment of FIG. 14 where the flexible sheet is transparent and the liquid acts like a lens focusing solar rays on a target below the flexible sheet.

It is contemplated that this arrangement could also be used with a clear flexible sheet 409' so that the liquid 447' acts as a lens, focusing the solar rays on a target 417' under the flexible sheet 409' as schematically illustrated in FIG. 16. The receiver 421' and focus correction apparatus 423' are mounted on an arm and actuator mechanism 449' under the flexible sheet 409' to follow the target 417'.

Figure 17:
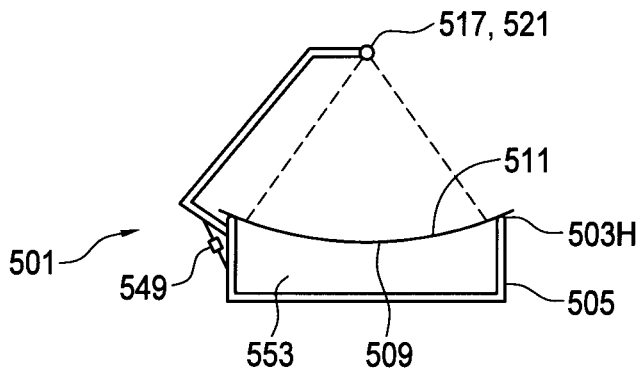
FIG. 17 is a schematic end view of an embodiment of a horizontal solar concentrator apparatus of the present invention with a semi-rigid flexible sheet bent by gravity.

FIG. 17 schematically illustrates an further alternate apparatus 501 where the framework 505 comprises a plurality of substantially horizontal frame members 503H forming an open center area 553, and the flexible sheet 509 is a very thin semi-rigid sheet of polished metal or glass, for example gorilla glass, that flexes readily but has more rigidity than the thin film described above. The shaping force system comprises placing the semi-rigid flexible sheet 509 on the framework 505 with the reflective surface 511 thereof facing upward such that the glass flexible sheet 505 is supported at peripheral portions thereof by the horizontal frame members 503H, and such that gravitational forces draw the semi-rigid flexible sheet 509 downward in the open center area 553.

The bottom of the semi-rigid sheet 509 slides on the horizontal frame members 503H and the sheet takes the natural shape dictated by gravity. Being supported only at peripheral portions, the semi-rigid flexible sheet 509 takes a substantially catenary shape, which shape is close to a parabolic shape, such that focus correction may not always be required. Again, as the apparatus 501 must be oriented horizontally so gravity acts on the semi-rigid flexible sheet 509 as required, the target 517 will move as the sun crosses the sky, and the receiver 521 is mounted on an arm and actuator mechanism 549 of the framework 505 that is operative to move the receiver 521 to follow the target 517. It is contemplated again as well that a clear glass sheet could be used and act as a lens to concentrate the solar rays, as described above with respect to the liquid apparatus of FIG. 16. Once the semi-rigid flexible sheet has drooped to the desired shape, supports could added if required to prevent the sheet from moving during windy conditions.

It is further contemplated that the liquid apparatus 401 and thin bent glass apparatus 501 could also be used in a trough configuration.

Figure 18:
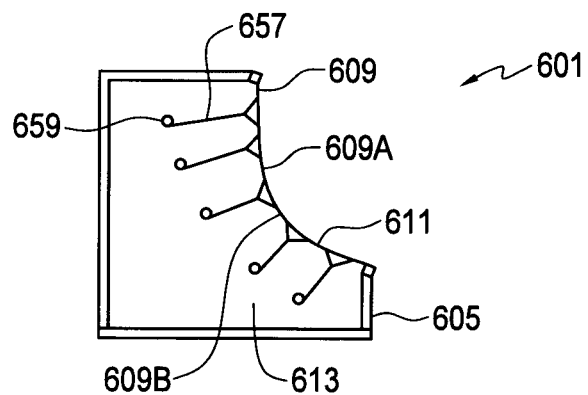
FIG. 18 a schematic end view of a further alternate embodiment of a thin film solar concentrator apparatus of the present invention where the shaping force system pulls wires attached to the flexible sheet to form the reflective surface into the desired shape.

FIG. 18 schematically illustrates a further alternate apparatus 601. The flexible sheet 609 comprises first and second sides 609A, 609B. The shaping force system 613 comprises a plurality of wires 657 attached to the second side 609B of the flexible sheet 609 at one end and attached to winches 659 at the other end. When activated, the shaping force system 613 operates the winches 659 to pull on the wires 657 to draw the flexible sheet 609 into a position where the reflective surface 611 assumes a concave curved shape, and when deactivated the shaping force system 613 releases the wires 657. The shaping force system 613 can be configured to draw the flexible sheet 609 into a parabolic shape, and can be used in a trough or point focus configuration or as a combination heliostat/concentrator for solar towers. The reflective coating can be on either side of the flexible sheet 609, since both are exposed to the elements.

Figure 19:
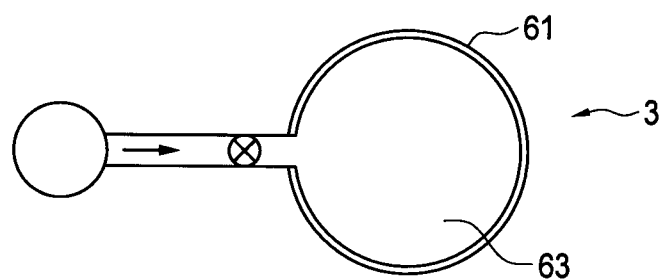
FIG. 19 is a schematic end view of a light weight frame member for use in the framework of embodiments of the present invention, where the frame member is a thin wall tube reinforced by filling same with pressurized air.

To further reduce the weight of any of the concentrator apparatuses, the frame members 3 can be made of light thin wall tubing 61 of metal, plastic or the like that is strengthened and reinforced by filling the interior thereof with pressurized air 63, as schematically illustrated in FIG. 19. A compressor pumps pressurized air into the interior of the tube 61, and the pressure inside the tube 61 is monitored with a sensor to add pressurized air as required to maintain the pressure at the desired level. It is contemplated that air pressure of 15 to 200 pounds per square inch (psi) will significantly increase the rigidity of the tube 61, and be readily maintained without rupturing the tube 61. It is contemplated that larger diameter tubes would typically require less pressure than smaller diameter tubes. For example, a 15 inch diameter tube with a much lower pressure can have as much force as a 3 inch diameter tube of a much higher pressure since the larger tube in this example has a surface area 5 times larger for a given length of tube.

FIG. 20 schematically illustrates a further alternate apparatus 701 wherein the flexible sheet 709 forms a concave trough concentrator with the reflective surface 711 oriented as shown to focus solar rays on the receiver 721 which comprises a line of photovoltaic solar cells. As described above the trough concentrator could also be one where the flexible sheet forms a pressurized vessel, such as with a football shaped cross-section, or other trough concentrator of the invention. A focus correcting device 723 in the illustrated apparatus 701 comprises a lens mounted on the framework and operative to correct the focus of the solar rays on the receiver 721. A cooling conduit 767 extends along the line of photovoltaic solar cells opposite the flexible sheet 709, and a heat sink 769 is operative to absorb heat from fluid flowing in the cooling conduit 767. It is contemplated that the temperature of the cooling fluid could range from 50° C. to about 100° C., which could be useful for heating buildings, water, and beneficially satisfy like lower temperature heating requirements.

Figure 21:
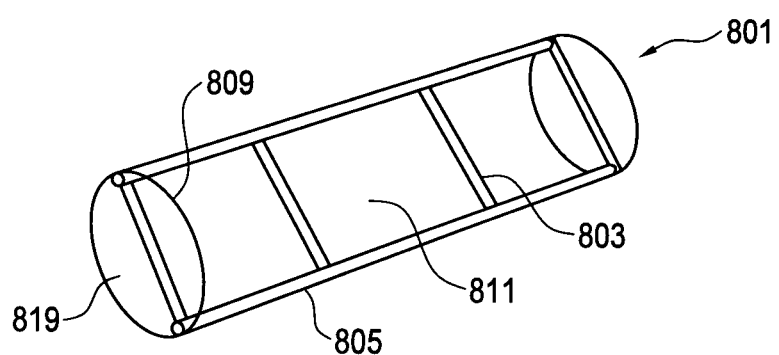
FIG. 21 is a schematic perspective view of a further alternate embodiment of a thin film solar concentrator apparatus of the present invention with a pressurized chamber where the flexible sheet forms a concave trough concentrator, and having a framework inside the chamber.

FIG. 21 schematically illustrates a further alternate concave trough concentrator apparatus 801 wherein the flexible sheet 809 forms a pressurized chamber 819 with the football shaped cross-section. In the apparatus 801, the supporting framework 805 is inside the chamber. There will be shade cast by the internal frame members 803 on the flexible sheet 811, however this embodiment is quite simple and economical so it is contemplated that the small amount of shadowing produced by these internal supports 803, it will likely be less expensive on a per unit energy basis.

The present invention thus provides a method of making a solar concentrator. The method comprises connecting frame members to form a framework; loosely attaching a flexible sheet to of the framework such that the flexible sheet takes a loose shape and can flex in response to shaping forces exerted thereon, the flexible sheet having a reflective surface located between the frame members; exerting the shaping forces on the flexible sheet, the shaping forces configured to draw the flexible sheet into a desired shape such that solar rays striking the reflective surface portion are substantially focused on a target; attaching a solar energy receiver to the framework at a location substantially corresponding to the target; wherein removing the shaping forces causes the flexible sheet to revert substantially to the loose shape.

The solar concentrator of the invention has a weight that is a fraction of the weight of metal and glass concentrators of the prior art, and that is significantly less than the stretched film concentrators, which need a framework with sufficient strength to resist the stretching forces that need to be exerted and maintained on the film. In the present invention, very little weight is or tension is present on the framework that must be moved by the tracking system. In the heavier embodiments, such as where liquid is supported, the framework supporting the liquid is stationary.

It is contemplated that the low cost of the concentrator of the present invention will overcome any reduction in efficiency, since many more concentrators can be provided for minimal cost to overcome any deficiencies.

The foregoing is considered as illustrative only of the principles of the invention. Further, since numerous changes and modifications will readily occur to those skilled in the art, it is not desired to limit the invention to the exact construction and operation shown and described, and accordingly, all such suitable changes or modifications in structure or operation which may be resorted to are intended to fall within the scope of the claimed invention.

What is claimed is:

1. A solar concentrator apparatus comprising:
   a plurality of frame members connected together to form a framework;
   a flexible sheet attached to the framework such that the flexible sheet takes a loose shape and can flex in response to shaping forces exerted thereon, the flexible sheet having a reflective surface located between the frame members;
   a shaping force system operative, when activated, to exert the shaping forces on the flexible sheet, the shaping forces configured to draw the flexible sheet from the loose shape into a desired shape such that solar rays striking the reflective surface are substantially focused on a target;
   a solar energy receiver attached to the framework at a location substantially corresponding to the target;
   wherein when the shaping force system is deactivated, the flexible sheet reverts substantially to the loose shape;
   a deflection sensor operative to sense deflection of the flexible sheet away from the desired shape, and a deflection adjuster operative to correct the deflection;
   wherein when activated, the reflective surface of the flexible sheet forms a concave trough concentrator;
   wherein the deflection adjuster comprises a rod extending substantially parallel to the frame members, and
   wherein the flexible sheet winds around the rod such that rotating the rod in a first direction increases a radius of the concave trough and rotating the rod in an opposite second direction decreases the radius of the concave trough concentrator.

2. The apparatus of claim 1 wherein the flexible sheet is a thin film material and the shaping force system exerts the shaping forces by creating an air pressure differential between opposite first and second sides of the flexible sheet.

3. The apparatus of claim 2 wherein the first side of the flexible sheet is exposed to the atmosphere, and wherein when activated, the shaping force system draws air away from the second side of the flexible sheet such that a vacuum is formed and the flexible sheet flexes such that the reflective surface assumes a concave curved shape.

4. The apparatus of claim 3 wherein the framework comprises substantially parallel upper and lower front frame members extending between right and left ends of the framework, and wherein the flexible sheet is supported on the upper and lower front frame members with the first side thereof facing forward between the upper and lower front frame members, and forms a front side of a sealed chamber, and wherein when activated, the shaping force system draws air out of the chamber and the reflective surface of the flexible sheet forms a concave trough concentrator.

5. The apparatus of claim 4 wherein the flexible sheet wraps around the outside of the framework and forms the sealed chamber.

6. The apparatus of claim 4 comprising a focus correcting device mounted on the framework and operative to correct the focus of the solar rays on the receiver.

7. The apparatus of claim 6 wherein the focus correcting device comprises one of a lens located between the reflective surface and the receiver, and a mirror located such that the receiver is between the reflective surface and the mirror.

8. The apparatus of claim 4 wherein the atmosphere inside the chamber comprises a dry gas.

9. The apparatus of claim 3 wherein the framework comprises perimeter front frame members wherein the flexible sheet is supported on the perimeter front frame members with the first side thereof facing forward between the upper and lower front frame members, and forms a front side of a sealed chamber, and wherein when activated, the shaping force system draws air out of the chamber and the reflective surface of the flexible sheet forms a point focus concentrator.

10. The apparatus of claim 9 wherein the flexible sheet is preformed prior to attachment to the framework such that when the shaping force system is activated, the reflective surface of the flexible sheet substantially takes the form of a parabolic dish.

11. The apparatus of claim 10 comprising a focus correcting device mounted on the framework and operative to correct the focus of the solar rays on the receiver.

12. The apparatus of claim 11 wherein the focus correcting device comprises one of a lens located between the reflective surface and the receiver, and a mirror located such that the receiver is between the reflective surface and the mirror.

13. A solar concentrator apparatus comprising:
a plurality of frame members connected together to form a framework;
a flexible sheet attached to the framework such that the flexible sheet takes a loose shape and can flex in response to shaping forces exerted thereon, the flexible sheet having a reflective surface located between the frame members;
a shaping force system operative, when activated, to exert the shaping forces on the flexible sheet, the shaping forces configured to draw the flexible sheet from the loose shape into a desired shape such that solar rays striking the reflective surface are substantially focused on a target;
a solar energy receiver attached to the framework at a location substantially corresponding to the target;
wherein when the shaping force system is deactivated, the flexible sheet reverts substantially to the loose shape;
a deflection sensor operative to sense deflection of the flexible sheet away from the desired shape, and a deflection adjuster operative to correct the deflection;
wherein the framework comprises substantially parallel upper and lower front frame members extending between right and left ends of the framework,
wherein the deflection adjuster is operative to adjust a distance between the upper and lower front frame members.

14. The apparatus of claim 13 wherein the flexible sheet is a thin film material and the shaping force system exerts the shaping forces by creating an air pressure differential between opposite first and second sides of the flexible sheet.

* * * * *